US009553385B2

(12) United States Patent
Beck et al.

(10) Patent No.: US 9,553,385 B2
(45) Date of Patent: Jan. 24, 2017

(54) ELECTRONIC DEVICE COMPRISING AN ELECTRONIC CONNECTOR AND A FLEXIBLE PRINTED CIRCUIT

(71) Applicant: DXO LABS, Boulogne-Billancourt (FR)

(72) Inventors: Justin Michael Beck, Palo Alto, CA (US); Daniel Zisuk Lee, Queensbury, NY (US); Jose Remberto Carranza, South San Francisco, CA (US); Daniel Koelker, San Francisco, CA (US); Russell Zinner, Bend, OR (US); Jeffrey Eugene Neaves, Duluth, GA (US); Ethan Lowell Burton, Atlanta, GA (US); Martin Fichter, San Francisco, CA (US)

(73) Assignee: DXO LABS, Boulogne-Billancourt (FR)

( * ) Notice: Subject to any disclaimer, the term of this patent is extended or adjusted under 35 U.S.C. 154(b) by 0 days.

(21) Appl. No.: 14/743,060

(22) Filed: Jun. 18, 2015

(65) Prior Publication Data

US 2016/0372851 A1     Dec. 22, 2016

(51) Int. Cl.
*H01R 3/00* (2006.01)
*H01R 12/79* (2011.01)

(52) U.S. Cl.
CPC .................................. *H01R 12/79* (2013.01)

(58) Field of Classification Search
CPC ......... H01R 12/79; H01R 12/62; H05K 3/365; H05K 1/118; H05K 3/326
USPC .............................................. 439/67, 77, 65
See application file for complete search history.

(56) References Cited

U.S. PATENT DOCUMENTS

| 5,250,758 | A | * | 10/1993 | Fjelstad | H02G 3/00 174/254 |
| 5,384,431 | A | * | 1/1995 | Tusques | B25J 19/0029 174/117 F |
| 5,495,076 | A | * | 2/1996 | Davis | B60R 16/0215 174/250 |
| 5,655,285 | A | * | 8/1997 | Bonn | G11B 5/4846 29/469.5 |
| 5,751,544 | A | * | 5/1998 | Song | G06F 1/1616 16/261 |
| 5,914,853 | A | * | 6/1999 | Motoe | G06F 1/1616 16/223 |
| 5,978,210 | A | * | 11/1999 | McCrary | G06F 1/1616 174/89 |
| 5,995,373 | A | * | 11/1999 | Nagai | G06F 1/1616 16/223 |

(Continued)

*Primary Examiner* — Tulsidas C Patel
*Assistant Examiner* — Peter G Leigh
(74) *Attorney, Agent, or Firm* — IM IP Law; C. Andrew Im

(57) ABSTRACT

An electronic device includes an electronic connector, a flexible printed circuit and a structure having a stationary printed circuit board. The electronic connector rotates according to a first pivot axis and a second pivot axis with respect to the structure. The flexible printed circuit is fixed to the electronic connector and the stationary printed circuit board, and transfers an electronic current between the electronic connector and the stationary printed circuit board. The flexible printed circuit board comprises a first partly circular bend moving in response to the rotation of the electronic connector according to the first pivot axis and a second partly circular bend moving in response to the rotation of the electronic connector according to the second pivot axis.

12 Claims, 4 Drawing Sheets

(56) References Cited

U.S. PATENT DOCUMENTS

| | | | | |
|---|---|---|---|---|
| 6,144,559 A * | 11/2000 | Johnson | G01R 1/0416 | 174/255 |
| 6,275,376 B1 * | 8/2001 | Moon | G06F 1/162 | 345/168 |
| 6,788,527 B2 * | 9/2004 | Doczy | G06F 1/1626 | 312/208.1 |
| 6,830,456 B2 * | 12/2004 | Obermeyer | H01R 35/04 | 248/917 |
| 7,346,375 B2 * | 3/2008 | Sato | G06F 1/1681 | 16/302 |
| 7,369,414 B2 * | 5/2008 | Kim | H05K 1/028 | 361/679.33 |
| 7,375,956 B2 * | 5/2008 | Chuang | E05D 3/10 | 16/312 |
| 7,379,292 B2 * | 5/2008 | Tsai | G06F 1/1616 | 361/679.27 |
| 7,724,478 B2 * | 5/2010 | Deguchi | G11B 5/486 | 360/245.9 |
| 7,787,245 B2 * | 8/2010 | Prabhune | G06F 1/162 | 361/679.27 |
| 7,800,893 B2 * | 9/2010 | Tracy | G06F 1/162 | 248/921 |
| 7,894,003 B2 * | 2/2011 | Chang | B60R 11/0235 | 348/836 |
| 8,014,839 B2 * | 9/2011 | Ma | H04M 1/0212 | 16/264 |
| 8,250,712 B2 * | 8/2012 | Kim | H04M 1/0212 | 16/361 |
| 8,259,417 B1 * | 9/2012 | Ho | G11B 5/4833 | 360/245.9 |
| 8,437,146 B2 * | 5/2013 | Ahn | H04M 1/0212 | 361/755 |
| 8,630,089 B2 * | 1/2014 | Holman, IV | H04M 1/0227 | 361/679.56 |
| 8,861,187 B2 * | 10/2014 | Takahashi | G06F 1/162 | 361/679.06 |
| 8,941,951 B2 * | 1/2015 | Bennin | G11B 5/486 | 360/240 |
| 9,261,917 B2 * | 2/2016 | Chen | G06F 1/162 | |
| 2003/0064758 A1 * | 4/2003 | Mizuta | H04M 1/0212 | 455/566 |
| 2004/0132482 A1 * | 7/2004 | Kang | G06F 1/1616 | 455/550.1 |
| 2004/0192422 A1 * | 9/2004 | Watanabe | H04M 1/0212 | 455/575.3 |
| 2004/0198474 A1 * | 10/2004 | Jung | H04M 1/0212 | 455/575.1 |
| 2006/0063570 A1 * | 3/2006 | Nishimura | H04M 1/021 | 455/575.3 |
| 2014/0049895 A1 * | 2/2014 | Lee | H05K 5/0017 | 361/679.28 |

\* cited by examiner

ELECTRONIC DEVICE COMPRISING AN ELECTRONIC CONNECTOR AND A FLEXIBLE PRINTED CIRCUIT

FIELD OF THE INVENTION

The present invention relates to an electronic device comprising an electronic connector, a flexible printed circuit and a structure.

The present invention more particularly pertains to the field of flexible printed circuits and more particularly to flexible printed circuits between two parts of a device rotating according to two pivot axes.

BACKGROUND OF THE INVENTION

When an electronic connection between two devices in movement according to one another is implemented, the electronic connection must be maintained throughout the whole movement of the devices. In prior art, there usually are electric cables connected on the two devices that bend and twist to follow the movement of the cables. For example, such cables are winded onto rotating axes and unwind when one device rotates with regards to the other. However, such systems may jam or the cable can twist into an angle damaging to the wires found inside said cable and the system can be damaged. Also, there is no way to predict the position of the cable with regards to the devices and the cable can get stuck into the mechanism of the devices therefore damaging the mechanism and the cable, and the electronic connection can no longer be established.

SUMMARY OF THE INVENTION

The present invention aims at solving the above-mentioned drawbacks that are present in the solutions of the prior art. In particular, the present invention relates to an electronic device comprising an electronic connector, a flexible printed circuit and a structure wherein the flexible printed circuit has two rotational degrees of freedom in order to maintain an electronic connection between the electronic connector and a printed circuit board of the structure while the electronic connector rotates around a first pivot axis or a second pivot axis.

To this end, according to a first aspect, the present invention envisages an electronic device comprising an electronic connector, a flexible printed circuit and a structure comprising a stationary printed circuit board wherein:
  the electronic connector rotates according to a first pivot axis and a second pivot axis with regards to the structure, and
  wherein the flexible printed circuit
    is fixed to the electronic connector and the stationary printed circuit board,
    transfers an electronic current between the electronic connector and the stationary printed circuit board,
    comprises a first partly circular bend moving when the electronic connector rotates according to the first pivot axis with regards to the structure,
    comprises a second partly circular bend moving when the electronic connector rotates according to the second pivot axis with regards to the structure.

Such an electronic device enables the rotation of the electronic connector with regards to the structure according to the first pivot axis and the second pivot axis. Moreover, electrical traces on the flexible printed circuit are not stressed due to the rotations of the electronic connector.

Also, the partly circular bends and the thickness of the flexible printed circuit keep the flexible printed circuit from twisting and getting stuck in the mechanism of the electronic device.

According to particular embodiments, at least one partly circular bend comprises at least half a circle.

A half circle enables the flexible printed circuit to be more compact and to have two parts of the flexible printed circuit parallel to one another without entering in contact.

According to particular embodiments, the first pivot axis and the second pivot axis are coplanar.

An advantage of this embodiment is to enable two rotational degrees of rotation between the structure and the electronic connector.

According to particular embodiments, the electronic device subject of the present invention comprises a swivel carriage module rotating with regards to the structure according to the second pivot axis, the electronic connector rotating according to the first pivot axis with regards to the swivel carriage module.

The swivel carriage module facilitates the rotation of the electronic connector with regards to the structure according to the first pivot axis and the second pivot axis.

According to particular embodiments, the swivel carriage module comprises at least one partly circular protrusion guiding the movement of at least one partly circular bend.

The partly circular protrusion guides the partly circular bend dynamically according to a predetermined course. The movement of partly circular bend is maintained in a predetermined course.

According to particular embodiments, a partly circular protrusion is in contact with a partly circular bend.

In these embodiments the movement of the partly circular bend is a modification of the radius of the partly circular bend when the electronic connector rotates according to the first pivot axis with regards to the structure.

The partly circular bend winds or unwinds when the electronic connector rotates according to the first pivot axis with regards to the structure. Such embodiments are particularly useful when the center of the circle of partly circular bend is located on a pivot axis.

According to particular embodiments, the length of the arc of a circular protrusion corresponds to the range of rotation of the electronic connector with regards to the structure.

The advantage of such embodiments is to provide a course to the movement of the partly circular bend when an axis defining the partly circular bend is parallel to a pivot axis.

Such embodiments enable the flexible printed circuit to be flexible enough for the partly circular bends to move and rigid enough for the flexible printed circuit to be assembled onto the electronic device.

According to particular embodiments, the flexible printed circuit is fixed to the swivel carriage module between the first and second partly circular bends.

The advantage of such embodiments is to dissociate the movement of the first partly circular bend from the movement of the second partly circular bend.

BRIEF DESCRIPTION OF THE DRAWINGS

Other advantages, aims and particular embodiments subject of the present invention will become apparent from the description that will follow, made, as an example that is in no way limiting, with reference to the drawings included in an appendix, in which.

DETAILED DESCRIPTION OF THE EMBODIMENTS

It should be noted that the drawings are not according to scale.

Through the description, the terms "electronic device" designate any electronic device through which information can be exchanged, such as a smartphone, a tablet, a digital camera or mobile speakers, for instance.

On FIGS. 1 to 6, embodiments of a flexible printed circuit 110 are depicted with a bold line.

Figure 1:
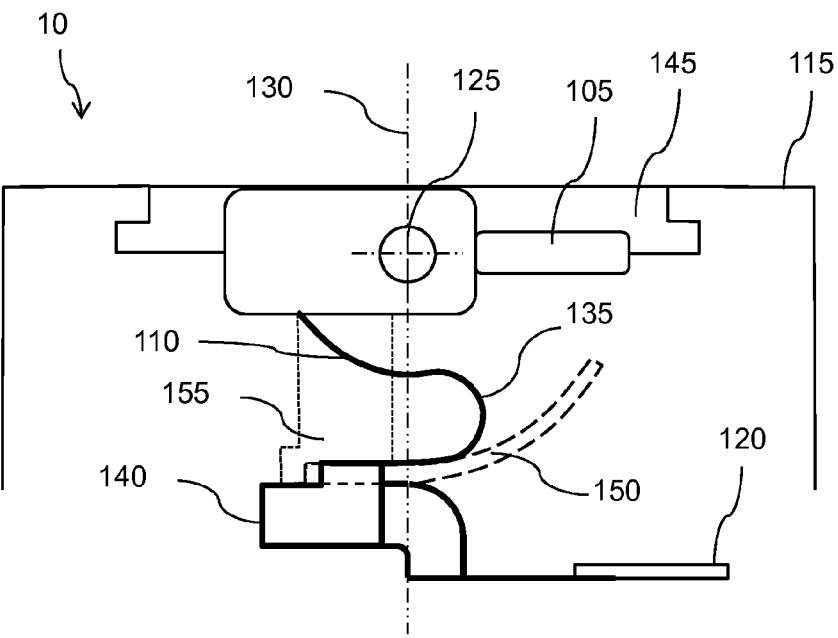
FIG. 1 represents, schematically, in a side cross-section, a first particular embodiment of the electronic device subject of the invention in which the electronic connector is in a retracted position.

FIG. 1 represents, a first particular embodiment of the electronic device 10 subject of the present invention.

The electronic device 10 comprises an electronic connector 105. The electronic connector 105 can be a female electronic connector or a male electronic connector. Preferably, the electronic connector 105 is a male electronic connector. The electronic connector 105 can be:

a USB (Universal Serial Bus) connector,
a micro-USB connector,
a lightning connector (Registered Trademark from Apple Inc.),
or any kind of electronic connector.

The electronic connector 105 enables a transfer of electronic current from the electronic device 10 to another electronic device comprising a corresponding electronic connector 105. The electronic connector 105 rotates according to a first pivot axis 125 and a second pivot axis 130 with regards to the structure. The electronic connector can comprise a frame comprising elements assembled to the structure 115 and corresponding to the first pivot axis 125 and the second pivot axis 130.

The first pivot axis 125 and the second pivot axis 130 are preferably coplanar. In particular embodiments, the first pivot axis 125 and the second pivot axis 130 are perpendicular. In other embodiments (not represented), the first pivot axis 125 and the second pivot axis 130 are parallel.

Preferably, the range of rotation of the electronic connector 105 with regards to the structure 115 according to the first pivot axis 125 is above one hundred and thirty degrees. Moreover, the range of rotation of the electronic connector 105 with regards to the structure 115 according to the second pivot axis 130 is above one hundred and ten degrees.

The first pivot axis 125 and the second pivot axis 130 are created using devices known by one skilled in the art to make a revolute joint. For example, by inserting a right circular cylindrical protrusion into a right circular cylindrical depression of similar diameter.

The electronic device 10 comprises a structure 115 comprising a stationary printed circuit board 120. The structure 115 is considered as the reference and is stationary in the following description of FIGS. 1 to 6. The stationary printed circuit board 120 is fixed to the structure 125. The printed circuit board 120 (or "PCB") mechanically supports and electrically connects electronic components using conductive tracks, pads and other features etched from copper sheets laminated onto a non-conductive substrate. The printed circuit board 120 is defined by a plane.

The electronic device 10 comprises a flexible printed circuit 110. The flexible printed circuit 110 is fixed to the electronic connector 105 at an end 180 and the stationary printed circuit board 120 at an end 175. The flexible printed circuit 110 transfers an electronic current between the electronic connector 105 and the stationary printed circuit board 120. The electric current is representative of data to transfer from the electronic device 10 to another electronic device via the electronic connector 105.

The width of the flexible printed circuit 110 is at least five times superior to the height of the flexible printed circuit 110, similarly to a ribbon. The length is the flexible printed circuit 110 is the distance between the ends of the flexible printed circuit 110 fixed to the electronic connector 105 and to the printed circuit board 120 when the flexible printed circuit 110 is laid flat. A partly circular bend, 135 or 140, is a roll in the flexible printed circuit 110 around an axis parallel to the width of the electronic connector 110 comprising the center of the circle defining the partly circular bend.

The flexible printed circuit 110 comprises a first partly circular bend 135 moving when the electronic connector 110 rotates according to the first pivot axis 125 with regards to the structure 115. The movement of the first partly circular bend 135 is due to the rotation of the electronic connector 105 with regards to the structure 115.

The flexible printed circuit 110 is preferably in an inextensible material. The first partly circular bend 135 is due to the material of the printed circuit 110 and the fact that the flexible printed circuit 110 is fixed onto the rotating electronic connector 105 and the stationary printed circuit board 120. The movement of the first partly circular bend 135 is a rolling of the flexible printed circuit 110 on itself.

Preferably, the movement of the first partly circular bend 135 is a shift of the position of the first partly circular bend 135 with regards to the flexible printed circuit 110, the first partly circular bend 135 maintaining the same radius throughout the movement. The location of first partly circular bend 135 in the flexible printed circuit 110 depends on the position of the electronic connector 105 with regards to the structure when the electronic connector 105 rotates according to the first pivot axis 125. In other embodiments, the movement of the first partly circular bend 135 is a reduction or an augmentation of the radius of the first partly circular bend 135.

Preferably, the axis around which the first partly circular bend 135 rolls is parallel to the first pivot axis 125.

The flexible printed circuit 110 comprises a second partly circular bend 140 moving when the electronic connector 105 rotates according to the second pivot axis 130 with regards to the structure 115. The movement of the second partly circular bend 140 is due to the rotation of the electronic connection 105 with regards to the structure 110.

The second partly circular bend 140 is due to the material of the printed circuit 110 and the fact that the flexible printed circuit 110 is fixed onto the rotating electronic connector 105 and the stationary printed circuit board 120. The movement of the second partly circular bend 140 is a rolling of the flexible printed circuit 110 on itself.

Preferably, the movement of the second partly circular bend 140 is a shift of the position of the second partly circular bend 140 with regards to the flexible printed circuit 110, the second partly circular bend 140 maintaining the same radius throughout the movement. The location of second partly circular bend 140 in the flexible printed circuit 110 depends on the position of the electronic connector 105 with regards to the structure when the electronic connector 105 rotates according to the second pivot axis 130. In other embodiments, the movement of the second partly circular bend 140 is a reduction or an augmentation of the radius of the radius circular bend 140.

Preferably, the axis around which the second partly circular bend 140 rolls is parallel to the second pivot axis 130.

Preferably, at least one partly circular bend, 135 and/or 140, comprises at least half a circle.

The electronic device 10 comprises a swivel carriage module 145 rotating with regards to the structure 115 according to the second pivot axis 130. The electronic connector 105 rotates according to the first pivot axis 125 with regards to the swivel carriage module 145.

The swivel carriage module 145 preferably comprises a circular outer surface inserted into a circular surface of the structure 125. The circular outer surface of the swivel carriage module 145 has a radius similar to the radius of the circular surface of the structure 125. The circular outer surface of the swivel carriage module 145 is inserted into the circular surface of the structure 125 creating a revolute joint.

The swivel carriage module 145 comprises at least one partly circular protrusion, 150, 155 and/or 160, guiding the movement of at least one partly circular bend, 135 and/or 140.

The swivel carriage module 145 comprises a first partly circular protrusion 150 guiding the movement of the first partly circular bend 135. The first partly circular protrusion 150 is in contact with the first partly circular bend 135 whatever the position of the partly circular bend 135. The length of the arc of the first partly circular protrusion 150 corresponds to the range of rotation of the electronic connector 105 with regards to the structure 115 according to the first pivot axis 125.

The circle defining the first partly circular protrusion 150 is comprised in a plane perpendicular to the first pivot axis 125. The plane comprises a contact surface 165 of the flexible printed circuit 110 between the first partly circular protrusion 150 and the first partly circular bend 135. The diameter of the first partly circular protrusion 150 is the distance in said plane between the first pivot axis 125 and contact surface 165 between the first partly circular protrusion 150 and the first partly circular bend 135.

The swivel carriage module 145 comprises a second partly circular protrusion 155 guiding the movement of the second partly circular bend 140. The second partly circular protrusion 155 is in contact with the second partly circular bend 140 whatever the position of the partly circular bend 140. The length of the arc of the second partly circular protrusion 155 corresponds to the range of rotation of the electronic connector 105 with regards to the structure 115 according to the second pivot axis 130.

The circle defining the second partly circular protrusion 155 is comprised in a plane perpendicular to the second pivot axis 130. The plane comprises a contact surface 200 of the flexible printed circuit 110 between the second partly circular protrusion 155 and the second partly circular bend 140. The diameter of the second partly circular protrusion 155 is the distance in said plane between the second pivot axis 130 and contact surface 200 between the second partly circular protrusion 155 and the second partly circular bend 140.

The structure 115 can comprise a third partly circular protrusion 160 guiding the movement of the second partly circular bend 140. The third partly circular protrusion 160 is in contact with the second partly circular bend 140 whatever the position of the partly circular bend 140. The length of the arc of the third partly circular protrusion 160 corresponds to the range of rotation of the electronic connector 105 with regards to the structure 115 according to the second pivot axis 130.

The circle defining the third partly circular protrusion 160 is comprised in a plane perpendicular to the second pivot axis 130. The plane comprises a contact surface 195 between the third circular protrusion 160 and the second partly circular bend 140. The diameter of the third partly circular protrusion 160 is the distance in said plane between the second pivot axis 130 and contact surface 195 between the third circular protrusion 160 and the second partly circular bend 140. The circle defining the third partly circular protrusion 160 is parallel to the circle defining the second partly circular protrusion 155 in the plane perpendicular to the second pivot axis 125.

Preferably, the contact between the second partly circular bend 140 and the second partly circular protrusion 155 is on a partly circular surface of the second partly circular protrusion 155 closest to the second pivot axis 125 in the plane perpendicular to the second pivot axis 125. The contact between the second partly circular bend 140 and the third partly circular protrusion 160 is on a partly circular surface of the third partly circular protrusion 160 furthest from the second pivot axis 125 in the plane perpendicular to the second pivot axis 125. The second partly circular bend 140 is constrained between the second partly circular protrusion 155 and third partly circular protrusion 160.

The flexible printed circuit 110 can be fixed to the second partly circular protrusion 155 by an adhesive on the contact surface 200. The fixation is out of the range of movement of the second partly circular bend 140 on the flexible printed circuit 110. The flexible printed circuit 110 can be fixed to the third partly circular protrusion 160 by an adhesive on the contact surface 195. The fixation is out of the range of movement of the second partly circular bend 140 on the flexible printed circuit 110.

In the preferred embodiments wherein the first pivot axis 125 is perpendicular to the second pivot axis 130, the flexible printed circuit 110 comprises at least one perpendicular fold between the range of movement of the first partly circular bend 135 and the range of movement of the second partly circular bend 140 on the flexible printed circuit 110.

The flexible printed circuit 110 comprises a first perpendicular fold 190 between the range of movement of the first partly circular bend 135 and the range of movement of the second partly circular bend 140 on the flexible printed circuit 110. The flexible printed circuit 110 comprises a second perpendicular fold 185 between the range of movement of the second partly circular bend 140 on the flexible printed circuit 110 and the end 175 of the flexible printed circuit 110 fixed to the printed circuit board 120.

Preferably, to provide independent movements of the first partly circular bend 135 and the second partly circular bend 140, the flexible printed circuit 110 is fixed to the swivel carriage module 145 between the first partly circular bend 135 and second partly circular bend 140. The surface of fixation 165 of the flexible printed circuit 110 to the swivel carriage module 145 is between the range of movement of the first partly circular bend 135 and the range of movement of the second partly circular bend 140 on the flexible printed circuit 110.

Figure 2:
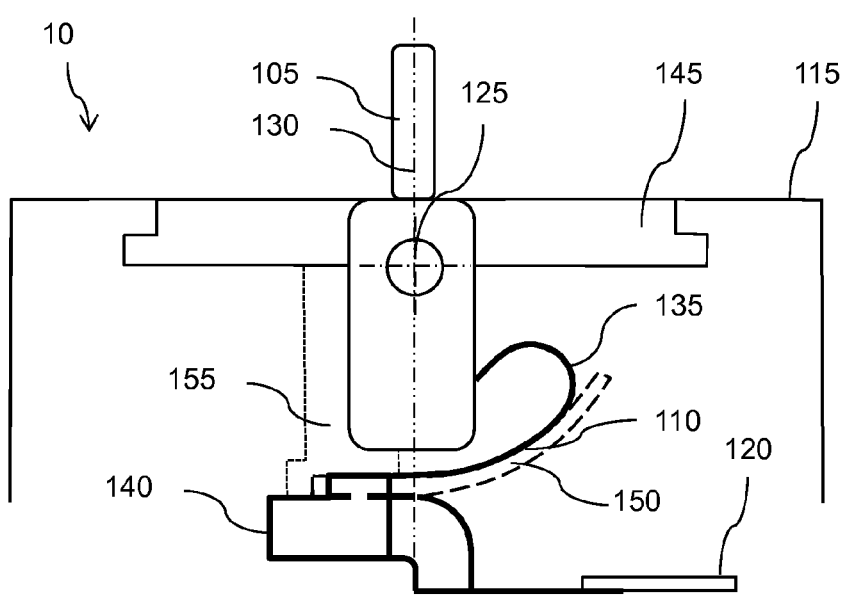
FIG. 2 represents, schematically, in a side cross-section, a first particular embodiment of the electronic device subject of the invention in which the electronic connector is in a deployed position after a rotation according to the first pivot axis.

FIG. 2 represents a first particular embodiment of the electronic device 10 wherein the electronic connector 105 is in a deployed position after a rotation according to the first pivot axis 125.

In FIG. 2, the electronic connector 105 has rotated according to the first pivot axis counterclockwise compared to FIG. 1. The position of the second partly circular bend 140 is maintained unchanged compared to FIG. 1.

The rotation of the electronic connector 105 moves the end of the electronic connector 110 fixed to the electronic connector 105. The first partly circular bend 135 rolls onto the first partly circular protrusion 150. The contact point between the first partly circular bend 135 and the first partly circular protrusion 150 follows the partly circular protrusion 150 counterclockwise. The parts of the former position of the partly circular bend 135 enter in contact with the first partly circular protrusion 150. The contact between the parts of the former position of the partly circular bend 135 and the first partly circular protrusion 150 is maintained due to the stiffness of the material of the flexible printed connector 110. The radius of the first partly circular bend 135 being unchanged.

Figure 3:
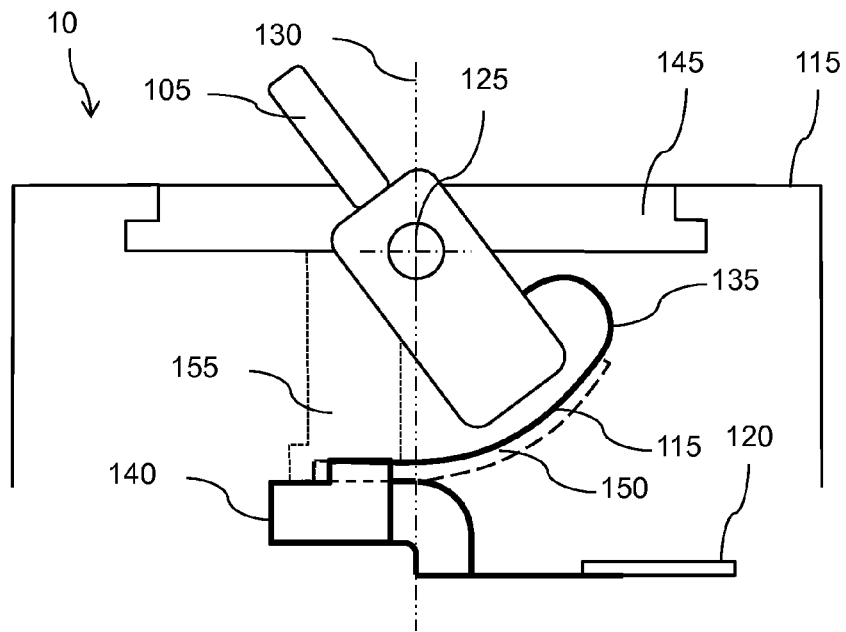
FIG. 3 represents, schematically, in a side cross-section, a first particular embodiment of the electronic device subject of the invention in which the electronic connector is in a deployed position said of over travel after a rotation according to the first pivot axis.

FIG. 3 represents a first particular embodiment of the electronic device 10 wherein the electronic connector 105 is in a deployed position said of over travel after a rotation according to the first pivot axis 125.

In FIG. 3, the electronic connector 105 has rotated according to the first pivot axis counterclockwise compared to FIG. 2. The position of the second partly circular bend 140 is maintained unchanged compared to FIG. 2.

The rotation of the electronic connector 105 moves the end of the electronic connector 110 fixed to the electronic connector 105. The first partly circular bend 135 rolls onto the first partly circular protrusion 150. The contact point between the first partly circular bend 135 and the first partly circular protrusion 150 follows the partly circular protrusion 150 counterclockwise. The parts of the former position of the partly circular bend 135 enter in contact with the first partly circular protrusion 150. The contact between the parts of the former position of the partly circular bend 135 and the first partly circular protrusion 150 is maintained due to the stiffness of the material of the flexible printed connector 110. The radius of the first partly circular bend 135 being unchanged.

Figure 4:
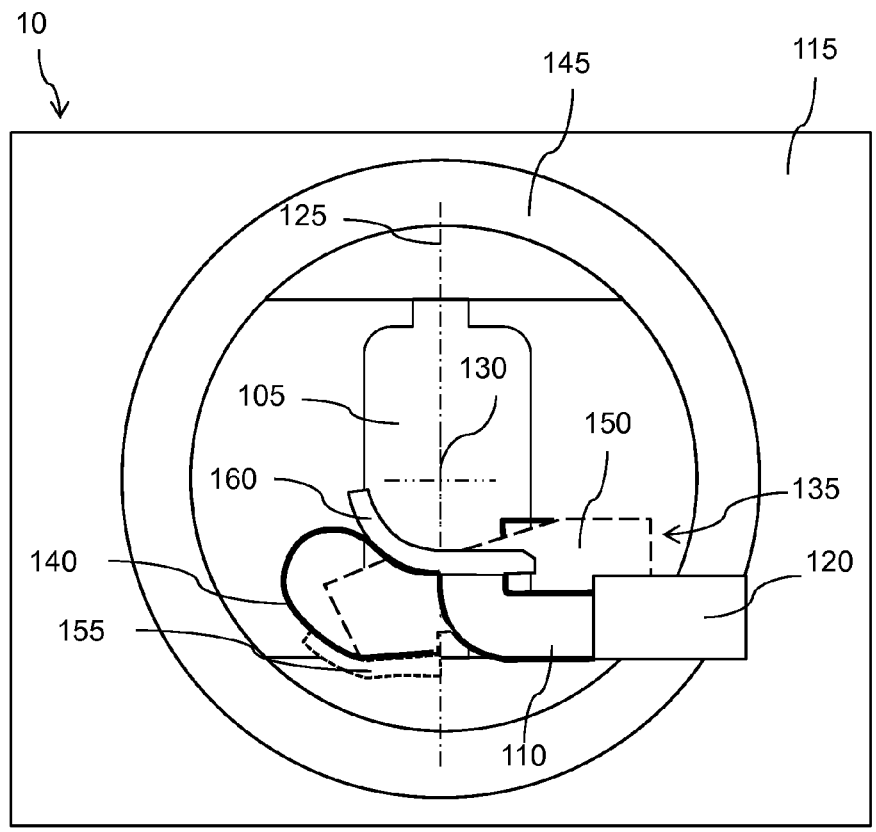
FIG. 4 represents, schematically, in a bottom cross-section, a first particular embodiment of the electronic device subject of the invention in which the electronic connector is in the deployed position of FIG. 2.

FIG. 4 represents a first particular embodiment of the electronic device 10 subject of the invention wherein the electronic connector 105 is in a deployed position of FIG. 2.

The flexible printed circuit 110 comprises the second partly circular bend 140 in between the second partly circular protrusion 155 and the third partly circular protrusion 160.

In the preferred embodiments wherein the first pivot axis 125 is perpendicular to the second pivot axis 130, the flexible printed circuit 110 comprises a first perpendicular fold 190 between the range of movement of the second partly circular bend 140 on the flexible printed circuit 110 and the fixation of the flexible printed circuit 110 to the printed circuit board 120. The flexible printed circuit 110 is fixed to the third partly circular protrusion 160 by an adhesive on the surface of fixation 195. The fixation is out of the range of movement of the second partly circular bend 140 on the flexible printed circuit 110. The flexible printed circuit 110 is fixed to the second partly circular protrusion 155 by an adhesive on the surface of fixation 200. The fixation is out of the range of movement of the second partly circular bend 140 on the flexible printed circuit 110.

Figure 5:
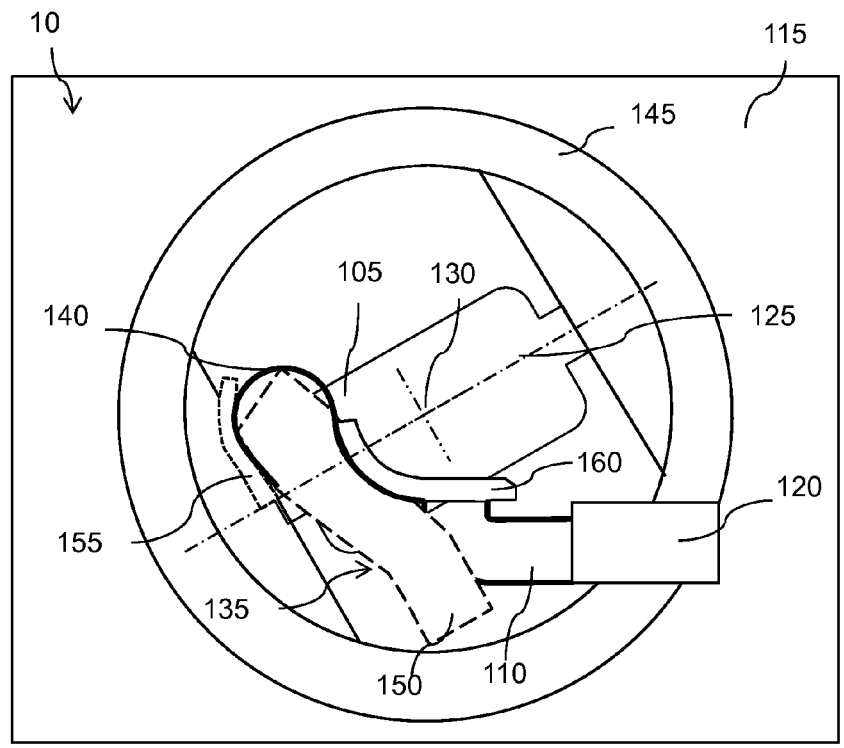
FIG. 5 represents, schematically, in a bottom cross-section, a first particular embodiment of the electronic device subject of the invention in which the electronic connector is in the deployed position of FIG. 2 after a rotation according to the second pivot axis.

FIG. 5 represents a first particular embodiment of the electronic device 10 wherein the electronic connector 105 is in a deployed position after a rotation according to the first pivot axis 125 and a rotation according to the second pivot axis 130.

In FIG. 5, the electronic connector 105 has rotated according to the second pivot axis 130 counterclockwise compared to FIG. 4. The position of the first partly circular bend 135 is maintained unchanged compared to FIG. 2.

The rotation of the electronic connector 105 moves the end of the electronic connector 110 fixed to the printed circuit board 120. The second partly circular bend 140 rolls onto the second partly circular protrusion 155 and onto the third partly circular protrusion 160. The contact point between the second partly circular bend 140 and the second partly circular protrusion 155 follows the second partly circular protrusion 155 counterclockwise. The contact point between the second partly circular bend 140 and the third partly circular protrusion 160 follows the third partly circular protrusion 160 counterclockwise.

The parts of the former position of the second partly circular bend 140 enter in contact with the second partly circular protrusion 155. The contact between the parts of the former position of the second partly circular bend 140 and the second partly circular protrusion 155 is maintained due to the stiffness of the material of the flexible printed connector 110. The radius of the second partly circular bend 140 is maintained unchanged.

The parts of the former position of the second partly circular bend 140 enter in contact with the third partly circular protrusion 160. The contact between the parts of the former position of the second partly circular bend 140 and the third partly circular protrusion 160 is maintained due to the stiffness of the material of the flexible printed connector 110.

Figure 6:
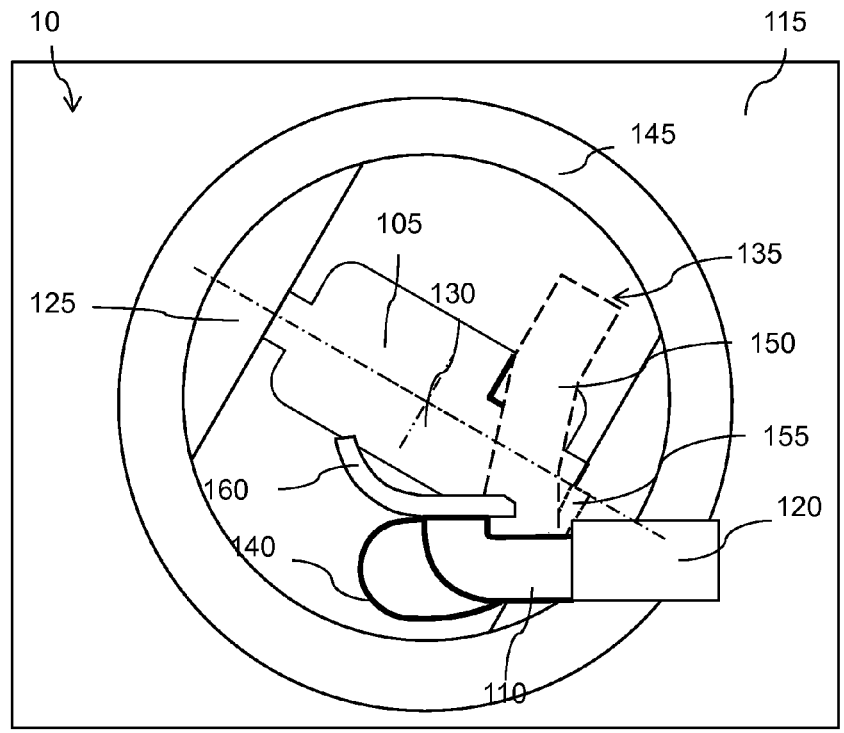
FIG. 6 represents, schematically, in bottom cross-section, a first particular embodiment of the electronic device subject of the invention in which the electronic connector is in the deployed position of FIG. 2 after another rotation according to the second pivot axis.

FIG. 6 represents a first particular embodiment of the electronic device 10 wherein the electronic connector 105 is in a deployed position after a rotation according to the first pivot axis 125 and a rotation according to the second pivot axis 130.

In FIG. 6, the electronic connector 105 has rotated according to the second pivot axis 130 clockwise compared to FIG. 4. The position of the first partly circular bend 135 is maintained unchanged compared to FIG. 2.

The rotation of the electronic connector 105 moves the end of the electronic connector 110 fixed to the printed circuit board 120. The second partly circular bend 140 rolls onto the second partly circular protrusion 155 and onto the third partly circular protrusion 160. The contact point between the second partly circular bend 140 and the second partly circular protrusion 155 follows the second partly circular protrusion 155 clockwise. The contact point between the second partly circular bend 140 and the third partly circular protrusion 160 follows the third partly circular protrusion 160 clockwise.

The parts of the former position of the second partly circular bend 140 enter in contact with the second partly circular protrusion 155. The contact between the parts of the former position of the second partly circular bend 140 and the second partly circular protrusion 155 is maintained due to the stiffness of the material of the flexible printed connector 110. The radius of the second partly circular bend 140 is maintained unchanged.

The parts of the former position of the second partly circular bend 140 enter in contact with the third partly circular protrusion 160. The contact between the parts of the former position of the second partly circular bend 140 and the third partly circular protrusion 160 is maintained due to the stiffness of the material of the flexible printed connector 110.

Figure 7:
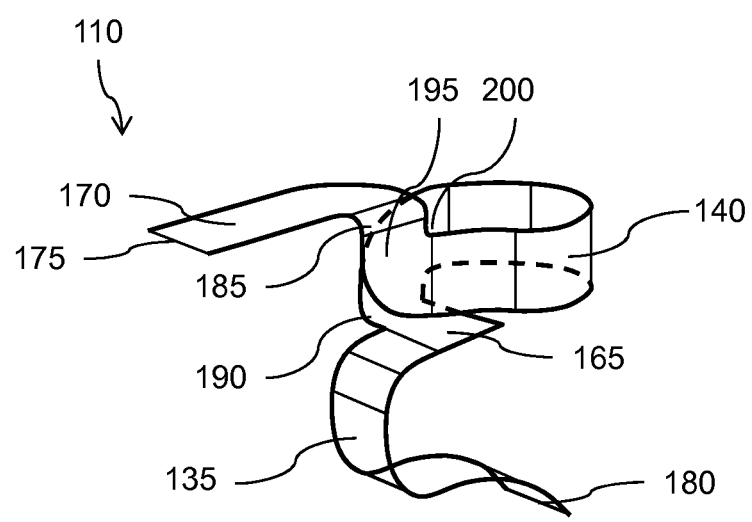
FIG. 7 represents, schematically, in a perspective, a first particular embodiment of a flexible printed circuit of the electronic device subject of the present invention.

FIG. 7 represents a first particular embodiment of a flexible printed circuit 110 of the electronic device 10.

The flexible printed circuit 110 in FIG. 7 is depicted in the position of the electronic connector 105 with regards to the structure 115 depicted in FIGS. 2 and 4.

The flexible printed circuit 110 comprises the first partly circular bend 135 and the second partly circular bend 140 as described during the description of FIG. 1.

The flexible printed circuit 110 is fixed to the printed circuit board 120 by the end 175 of the flexible printed circuit 110. The flexible printed circuit 110 comprises an extension 170 from the end 175 to the second perpendicular fold 185. The extension 170 is in a plane parallel to the plane of the printed circuit board 120.

The second perpendicular fold 185 is between the extension 170 and the surface of fixation 195 of the flexible printed circuit 110 to the third partly circular protrusion 160. The surface of fixation 195 makes a quarter of a circle away from the end 175, according to an axis parallel to the height of the flexible printed circuit 110. The surface of fixation 195 is linked to the range of movement of the second partly circular bend 140 and to the second perpendicular fold 185. The surface of fixation 195 is the surface of fixation of the flexible printed circuit 110 to the third partly circular protrusion 160.

A surface of fixation 200 makes a quarter of a circle towards the end 180, according to an axis parallel to the height of the flexible printed circuit 110. The surface of fixation 200 is the surface of fixation of the flexible printed circuit 110 to the second partly circular protrusion 155. The surface of fixation 200 is linked to the part of the flexible printed circuit 110 corresponding to the range of movement of the second partly circular bend 140 and to the first perpendicular fold 190. The surface of fixation 195 and the surface of fixation 200 are in planes perpendicular to the plane of the printed circuit board 120.

The first perpendicular fold 190 is between the surface of fixation 200 and the surface of fixation 165 of the flexible printed circuit 110 to the swivel carriage module 145.

The surface of fixation 165 is in a plane parallel to the plane of the printed circuit board 120. The surface of fixation 165 makes a quarter of a circle towards the end 175, according to an axis parallel to the height of the flexible printed circuit 110. The surface of fixation 165 links the first perpendicular fold 190 to part of the flexible printed circuit corresponding to the range of movement of the first partly circular bend 135.

The range of movement of the first partly circular bend 135 ends on the end 180 of the flexible printed circuit 110 linked to the electronic connector 105.

Although the above description sets forth particular embodiments of the present invention, modifications of the invention will be readily apparent to those skilled in the art, and it is intended that the scope of the invention be determined solely by the appended claims.

The invention claimed is:

1. An electronic device comprising:
   a structure comprising a stationary printed circuit board;
   an electronic connector configured to rotate according to a first pivot axis and a second pivot axis with respect to the structure;
   a flexible printed circuit fixed to the electronic connector and the stationary printed circuit board, the flexible printed circuit:
      transfers an electronic current between the electronic connector and the stationary printed circuit board;
      comprises a first partly circular bend moving in response to rotation of the electronic connector according to the first pivot axis with respect to the structure;
      comprises a second partly circular bend moving in response to rotation of the electronic connector according to the second pivot axis with respect to the structure; and
      wherein a location of the first partly circular bend and a location of the second partly circular bend in the flexible printed circuit depend on a position of the electronic connector on the structure.

2. The electronic device according to claim 1, wherein at least one partly circular bend comprises a bend of at least half a circle.

3. The electronic device according to claim 1, wherein the first pivot axis and the second pivot axis are coplanar.

4. The electronic device according to claim 1, further comprising a swivel carriage module rotating with respect to the structure according to the second pivot axis; and wherein the electronic connector rotates according to the first pivot axis with respect to the swivel carriage module.

5. The electronic device according to claim 4, wherein the swivel carriage module comprises at least one partly circular protrusion guiding the movement of at least one partly circular bend.

6. The electronic device according to claim 5, wherein a partly circular protrusion is in contact with said at least one partly circular bend.

7. The electronic device according to claim 5, wherein a length of an arc of said at least one partly circular protrusion corresponds to a range of rotation of the electronic connector with respect to the structure.

8. The electronic device according to claim 4, wherein the flexible printed circuit is fixed to the swivel carriage module between the first partly circular bend and the second partly circular bend.

9. The electronic device according to claim 1, wherein the first partly circular bend has a first radius which is maintained throughout the movement of the first partly circular bend.

10. The electronic device according to claim 1, wherein the second partly circular bend has a second radius which is maintained throughout the movement of the second partly circular bend.

11. The electronic device according to claim 1, wherein the first partly circular bend has a first radius which is modified during the movement of the first partly circular bend.

12. The electronic device according to claim 1, wherein the second partly circular bend has a second radius which is modified during the movement of the second partly circular bend.

* * * * *